(12) United States Patent
Lu

(10) Patent No.: US 12,183,822 B2
(45) Date of Patent: Dec. 31, 2024

(54) MOSFET STRUCTURE WITH CONTROLLABLE CHANNEL LENGTH BY FORMING LIGHTLY DOPED DRAINS WITHOUT USING ION IMPLANTATION

(71) Applicants: Invention And Collaboration Laboratory Pte. Ltd., Singapore (SG); ETRON TECHNOLOGY, INC., Hsinchu (TW)

(72) Inventor: Chao-Chun Lu, Taipei (TW)

(73) Assignees: INVENTION AND COLLABORATION LABORATORY PTE. LTD., Singapore (SG); ETRON TECHNOLOGY, INC., Hsinchu (TW)

(*) Notice: Subject to any disclaimer, the term of this patent is extended or adjusted under 35 U.S.C. 154(b) by 0 days.

(21) Appl. No.: 17/314,233

(22) Filed: May 7, 2021

(65) Prior Publication Data
US 2022/0320336 A1  Oct. 6, 2022

Related U.S. Application Data

(60) Provisional application No. 63/171,133, filed on Apr. 6, 2021.

(51) Int. Cl.
*H01L 29/78* (2006.01)
*H01L 21/02* (2006.01)
*H01L 29/66* (2006.01)

(52) U.S. Cl.
CPC ...... *H01L 29/7833* (2013.01); *H01L 21/0257* (2013.01); *H01L 21/02647* (2013.01);
(Continued)

(58) Field of Classification Search
CPC .......... H01L 21/0257; H01L 21/02647; H01L 21/823431; H01L 21/823821;
(Continued)

(56) References Cited

U.S. PATENT DOCUMENTS 6,071,783 A   6/2000  Liang et al.
9,136,329 B2  9/2015  Huang et al.
(Continued)

FOREIGN PATENT DOCUMENTS

DE      197 49 378 A1      5/1999
WO   WO 2011/064891 A1   6/2011

OTHER PUBLICATIONS

U.S. Office Action dated Dec. 23, 2022 for U.S. Appl. No. 17/318,097.
(Continued)

*Primary Examiner* — David C Spalla
(74) *Attorney, Agent, or Firm* — Birch, Stewart, Kolasch & Birch, LLP

(57) ABSTRACT

The present invention provides a new MOSFET structure with controllable channel length by forming lightly doped drains without using ion implantation. The MOSFET structure comprises a semiconductor wafer substrate with a semiconductor surface, a gate structure over the semiconductor surface, a channel region under the semiconductor surface, and a first conductive region electrically coupled to the channel region. The first conductive region comprises a lightly doped drain region independent from the semiconductor wafer substrate.

13 Claims, 7 Drawing Sheets

(52) U.S. Cl.
CPC .. *H01L 29/66492* (2013.01); *H01L 29/66795* (2013.01); *H01L 29/7851* (2013.01)

(58) Field of Classification Search
CPC ............... H01L 21/845; H01L 27/0886; H01L 27/0924; H01L 27/10879; H01L 27/1211; H01L 29/41791; H01L 29/66492; H01L 29/6659; H01L 29/66598; H01L 29/66795; H01L 29/7833; H01L 29/785; H01L 29/7851; H01L 29/7853; H01L 29/7855; H01L 29/78621; H01L 2029/7858; H01L 2029/7863
See application file for complete search history.

(56) References Cited

U.S. PATENT DOCUMENTS

| | | | |
|---|---|---|---|
| 2005/0285212 | A1 | 12/2005 | Tolchinsky et al. |
| 2006/0131657 | A1 | 6/2006 | Hamaguchi |
| 2008/0169490 | A1 | 7/2008 | Kawai |
| 2009/0224287 | A1 | 9/2009 | Shin et al. |
| 2009/0267149 | A1 | 10/2009 | Hua et al. |
| 2011/0049643 | A1 | 3/2011 | Matsuoka |
| 2013/0210207 | A1 | 8/2013 | Fukuda et al. |
| 2013/0316509 | A1* | 11/2013 | Qin ................ H01L 29/6659 438/294 |
| 2014/0191318 | A1* | 7/2014 | Lin ................ H01L 29/7833 257/344 |
| 2014/0217519 | A1* | 8/2014 | Qin ................ H01L 29/7848 438/300 |
| 2014/0252426 | A1 | 9/2014 | Huang et al. |
| 2014/0264445 | A1* | 9/2014 | Xiao ............... H01L 29/66636 438/294 |
| 2014/0264592 | A1 | 9/2014 | Oxland et al. |
| 2014/0312387 | A1 | 10/2014 | Kim |
| 2018/0286962 | A1* | 10/2018 | Bao ................ H01L 29/66545 |
| 2019/0096883 | A1 | 3/2019 | Chen et al. |
| 2022/0013582 | A1 | 1/2022 | Chen et al. |
| 2022/0077315 | A1* | 3/2022 | Lu ................ H01L 21/823475 |

OTHER PUBLICATIONS

Extended European Search Report for corresponding European Application No. 22165703.4, dated Aug. 25, 2022.
U.S. Office Action for U.S. Appl. No. 17/318,097, dated May 30, 2023.
Japanese Office Action for Japanese Application No. 2022-050169, dated Aug. 1, 2023, with English translation.
U.S. Office Action for U.S. Appl. No. 17/394,662 dated Aug. 29, 2023.
U.S. Office Action for U.S. Appl. No. 17/394,662, dated Dec. 26, 2023.
U.S. Office Action for U.S. Appl. No. 17/394,662, dated Apr. 10, 2024.

* cited by examiner

MOSFET STRUCTURE WITH CONTROLLABLE CHANNEL LENGTH BY FORMING LIGHTLY DOPED DRAINS WITHOUT USING ION IMPLANTATION

CROSS REFERENCE TO RELATED APPLICATIONS

This application claims the benefit of U.S. Provisional Application No. 63/171,133, filed on Apr. 6, 2021 and entitled "Complementary MOSFET Structure Using Novel Source/Channel/Drain Junction Structures with Localized Isolations in Silicon Substrate (LIS) to Reduce Leakages and Planar Areas Reserved for Preventing Latch-Up", the contents of which are incorporated herein by reference.

BACKGROUND OF THE INVENTION

1. Field of the Invention

The present invention relates to a MOSFET structure, and particularly to a MOSFET structure with precisely defined boundary edge of source/drain to the edge of the effective channel region to reduce current leakage.

2. Description of the Prior Art

FIG. 1 shows a state-of-the-art FIN-structure Field-Effect Transistors (FINFET) which is most widely used in today's Integrated Circuits (IC). The transistor gate structure 10 using some conductive material (like metal, polysilicon or polyside, etc.) over an insulator (such as oxide, oxide/nitride or some high-k dielectric, etc.) is formed on a 3D silicon surface whose sidewalls are isolated from those of other transistors by using insulation materials (e.g. oxide or oxide/nitride or other dielectrics). Using an NMOS transistor as example, there are source region 11 and drain region 12 which are formed by an Ion-implantation plus Thermal Annealing technique to implant high concentration n-type dopants into a p-type substrate (or a p-well) which thus results in two separated n+/p junction areas. Furthermore, to lessen impact ionization and hot carrier injection prior to highly doped n+/p junction, it is common to form a lightly doped-drain (LDD) region 13 before the highly doped n+ source/drain region by Ion-implantation plus Thermal Annealing technique, and such Ion-implantation plus Thermal Annealing technique frequently causes the LDD regions 13 penetrating into the portion of the 3D active regions which are underneath the gate structure, as shown in FIG. 1. Therefore, the effective channel between the LDD regions 13 is unavoidably shortened.

On the other hand, the advancement of manufacture process technologies is continuing to move forward rapidly by scaling down the geometries of devices in both horizontal and vertical dimensions (such as the minimum feature size called as Lamda (λ) is shrunk from 28 nm down to 5 nm or 3 nm). But many problems are introduced or getting worse due to such FinFET geometry scaling:

(1) Scaling down the gate/channel length aggravates the Short Channel Effects (SCE), that is, the leakage currents related to the transistor channel are increased even at the turn-off mode of the transistor as the n+ source region is getting closer to the n+ drain region in NMOS (called as Sub-threshold Leakage current).

(2) All junction leakages resulted by junction formation processes such as forming LDD (Lightly Doped Drain) structure into the substrate/well regions, n+ Source/Drain structures into p-substrate are getting worse to control since leakage currents occur through both perimeter and bottom areas where extra damages like vacant traps for holes and electrons are harder to be repaired due to lattice imperfections which have been created by ion-implantation.

(3) In addition, since the ion-implantation to form the LDD structure (or the n+/p junction in NMOS or the p+/n junction in PMOS) works like bombardments in order to insert ions from the top of a silicon surface straight down to the substrate, it is hard to create uniform material interfaces with lower defects from the Source and Drain regions to the channel and the substrate-body regions since the dopant concentrations are non-uniformly distributed vertically from the top surface with higher doping concentrations down to the junction regions with lower doping concentrations.

(4) As the device dimensions are scaled down, it's getting harder to align the LDD junction edge to the edge of Gate structure in a perfect position by only using the conventional self-alignment method of using gate, spacer and ion-implantation formation. In addition, the Thermal Annealing process for removing the ion-implantation damages must count on high temperature processing techniques such as Rapid Thermal Annealing method by using various energy sources or other thermal processes. One problem thus created is that a Gate-induced Drain Leakage (GIDL) leakage current is hard to be controlled regardless the fact that it should be minimized to reduce leakage currents; the other problem as created is that the effective channel length is difficult to be controlled and so the SCE is hard to be minimized.

SUMMARY OF THE INVENTION

The present invention provides a new MOSFET structure (such as FIN-structure Field-Effect Transistors (FINFET)) which may be implemented into inverters, NAND Gates, NOR Gates, static random access memories (SRAMs), cross-coupled amplifiers, and various circuit configurations. The novel MOSFET or FINFET structure greatly improves on or even solves at least one of the problems as stated above, especially minimizing current leakages, increasing channel-conduction performance and control, optimizing functions of source and drain regions and their closest physical intact to the channel region with a seamless orderly crystalline Lattice matchup. Especially, the novel transistor or FINFET structure has precisely defined the boundary edge of source/drain to the edge of the effective channel region.

According to one object of the invention, the MOSFET structure of the present invention comprises a semiconductor wafer substrate with a semiconductor surface, a gate structure over the semiconductor surface, a channel region under the semiconductor surface, and a first conductive region electrically coupled to the channel region. Especially, the first conductive region comprises a lightly doped drain region independent from the semiconductor wafer substrate.

According to one aspect of the invention, the lightly doped drain region abuts against the channel region.

According to another aspect of the invention, a location of a boundary between the lightly doped drain region and the channel region is precisely controllable.

According to another aspect of the invention, the boundary between the lightly doped drain region and the channel region is aligned or substantially aligned with an edge of the gate structure.

According to another object of the invention, the MOSFET structure of the present invention comprises a first trench formed below the semiconductor surface, wherein the first trench accommodates the lightly doped drain region.

According to another aspect of the invention, the lightly doped drain region is a L-shape LDD comprising a side LDD region covering a sidewall of the first trench and a bottom LDD covering a bottom wall of the first trench.

According to another aspect of the invention, the side LDD region abuts against the channel region, and the first conductive region further comprises a highly doped semiconductor region abutting against the side LDD region and the bottom LDD region.

According to another aspect of the invention, the heavily doped semiconductor region is shielded from the semiconductor wafer substrate.

According to another aspect of the invention, the sidewall of the first trench is aligned or substantially aligned with an edge of the gate structure.

According to another aspect of the invention, the channel region is a fin structure, and a vertical depth of the channel region is substantially the same as that of side LDD region.

According to another aspect of the invention, the L-shape LDD is formed by selective epitaxy growth or atomic layer deposition, the channel region is a fin structure, and the side LDD region is contacted to a first facet of the fin structure.

According to another aspect of the invention, the L-shape LDD is formed without ion implementation, the channel region is a fin structure, and the side LDD region is contacted to a first facet of the fin structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
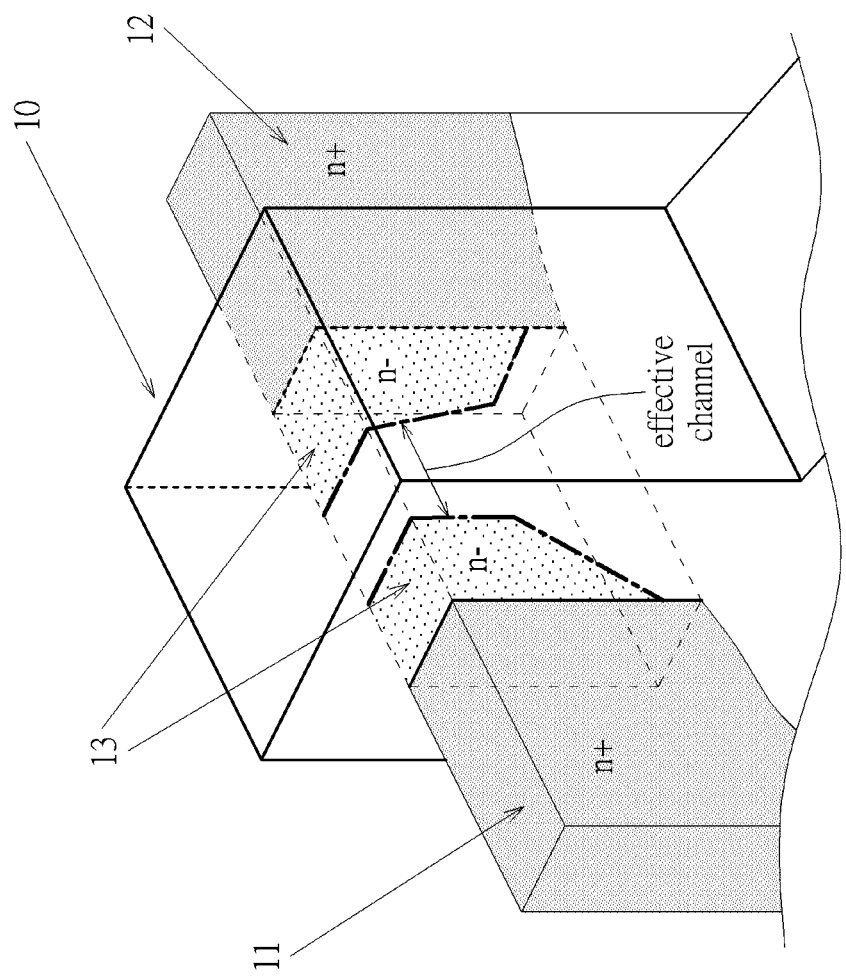
FIG. 1 is a diagram illustrating a traditional Fin-structure transistor.
Figure 2A:
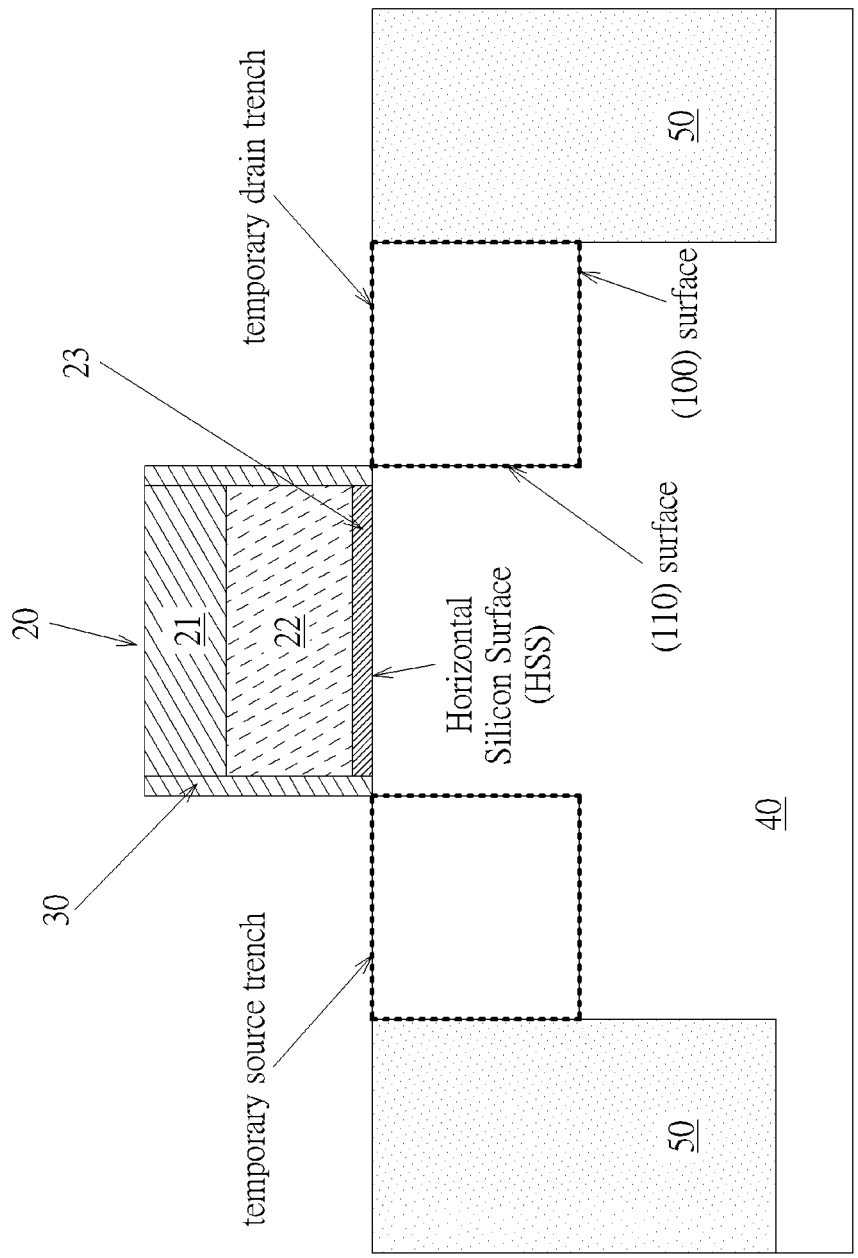
FIG. 2A is a diagram illustrating a cross section view of a partial NMOS fin-structure transistor structure completed after some processing steps to reach a stage which presents a substrate with body areas, the STI (shallow trench isolation) regions, and the gate structure.

A NMOS transistor or FINFET made in a p-type substrate (or p-well) is used as an example to illustrate the key attributes of this invention, and of course the present invention could be implemented in PMOS transistor or FINFET as well. FIG. 2A show a cross section view of the partial NMOS fin-structure transistor structure completed after some processing steps to reach a stage which presents a substrate 40 with body areas (or 3D active region) of the NMOS FINFET, the STI (shallow trench isolation) regions 50, and the gate structure 20. As shown in FIG. 2A, the gate structure 20 which may comprise a gate dielectric layer 21, gate conductive layer 22 (such as gate metal) and gate cap layer 23 are formed above the horizontal or original surface of the semiconductor substrate (or the top of the 3D active region). Spacers 30 which may include oxide layer and Nitride layer (not shown) are formed to cover sidewalls of the gate structure 20. Based on the edge of the spacer 30, temporary source trench and temporary drain trench are formed in the body areas (or 3D active regions) of the substrate 40 and under the horizontal silicon surface (HSS). In one embodiment, the edge of the source (or drain) temporary trench is aligned or substantially aligned with the edge of the spacer 30, as shown in FIG. 2A. The temporary source trench (or temporary drain trench) has a sidewall with (110) crystalline orientation which faces the transistor's body area of the substrate, and a bottom wall with (100) crystalline orientation.

Figure 2B:
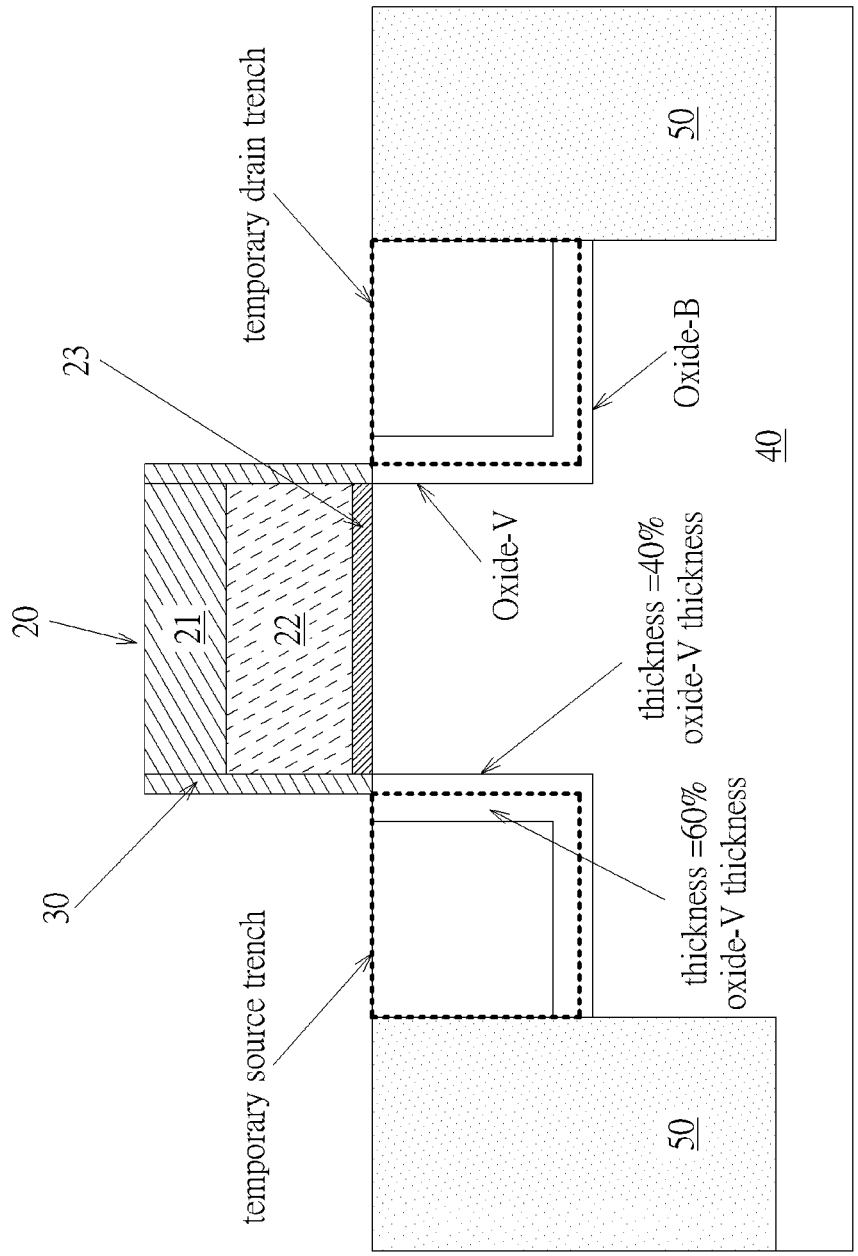
FIG. 2B is a diagram illustrating a cross section of a partial NMOS fin-structure transistor structure with thermal oxide layers covering sidewalls and bottom walls of the temporary trenches in FIG. 2A.

As shown in FIG. 2B, based on a thermal oxidation process, oxide-V layers penetrating the vertical sidewalls of the transistors' body area (with a sharp crystalline orientation (110)) and oxide-B layers on top of the bottom walls of the temporary source and drain trenches are formed. Wherein the thickness of the oxide-V layer and oxide-B layer drawn in FIG. 2B are only shown for illustration purpose, and its geometry is not proportional to the dimension of the STI 50 shown in those figures. For example, the thickness of the oxide-V layer and oxide-B layer is around 2~5 nm, but the vertical height of the STI layer could be around 200~300 nm. But it is very important to design this thermal oxidation process such that the thickness of oxide-V be very accurately controlled under both precisely controlled thermal oxidation temperature, timing and growth rate. Since the thermal oxidation over a well-defined silicon surface should result in that 40% of the thickness of oxide-V takes away the thickness of the exposed (110) silicon surface in the vertical wall of the transistor body area and the remaining 60% of the thickness of oxide-V be counted as an addition outside the vertical wall of the transistor body, as shown in FIG. 2B. Since the thickness of oxide-V is very accurately controlled based on the thermal oxidation process, the edge of the oxide-V could be controlled, such as the edge of the oxide-V could be aligned or substantially aligned with the edge of the gate structure.

Figure 2C:
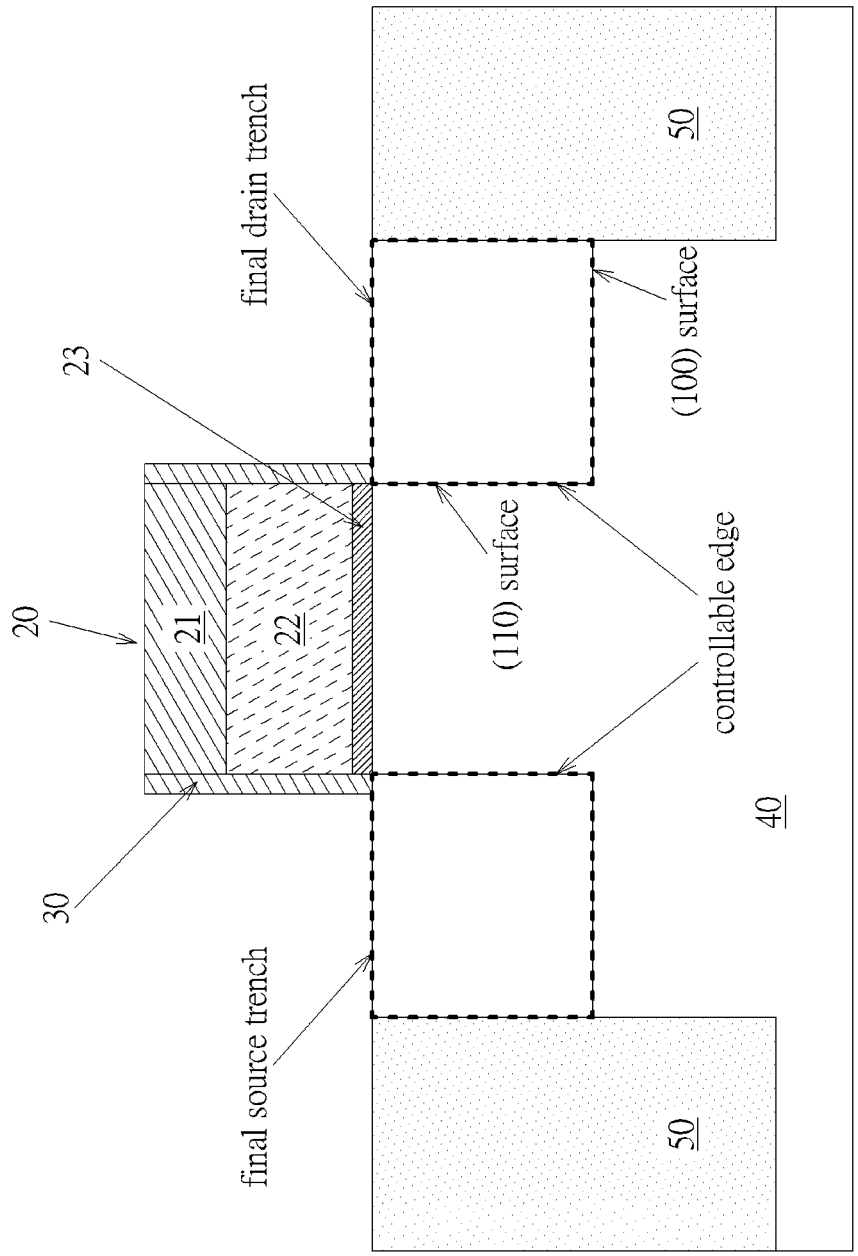
FIG. 2C is a diagram illustrating a cross section of a partial NMOS fin-structure transistor structure after the thermal oxide layers in FIG. 2B are etched away to reveal the final trenches.

The oxide-V and the oxide-B layers then could be etched away to form final source trench and final drain trench. Since the edge of the oxide-V could be well-controlled and aligned (or substantially aligned) with the edge of the gate structure, the edge of final source trench (or the final drain trench) would be controllable and aligned (or substantially aligned) with the edge of the gate structure, as shown in FIG. 2C. Of course, the vertical thickness of the final source trench (or the final drain trench) would be controllable as well. Again, the final source trench (or final drain trench) has a sidewall with (110) crystalline orientation which faces the transistor's body area of the substrate, and a bottom wall with (100) crystalline orientation.

Figure 2D:
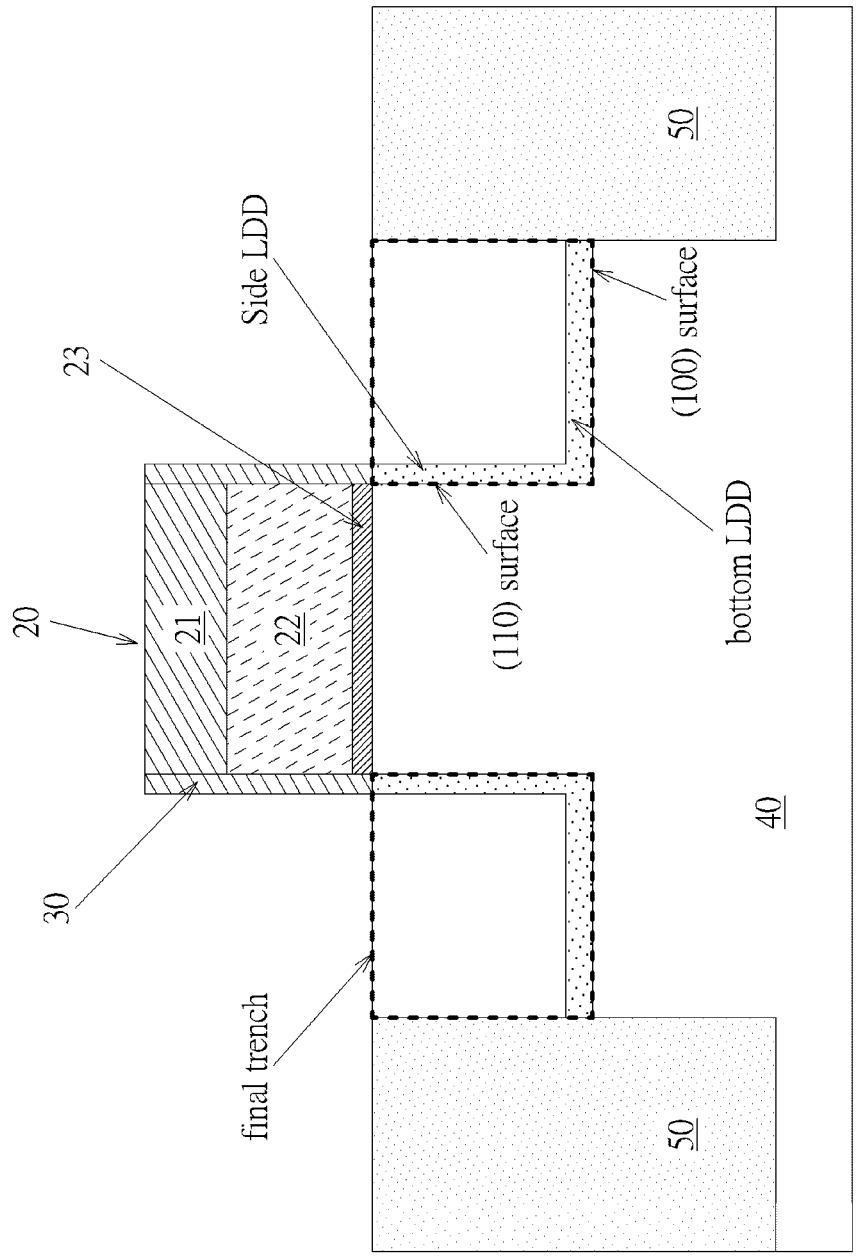
FIG. 2D is a diagram illustrating a cross section of a partial NMOS fin-structure transistor structure to form LDD regions by Selective Epitaxial Growth (SEG) technique to cover sidewalls and bottom walls of the final trenches in FIG. 2C.

Thereafter, a lightly doped drain (LDD) layer is formed to cover the sidewall and the bottom wall of the final source trench (or the final drain trench), as shown in FIG. 2D.

Specifically, the lightly doped drain (LDD) could be a L-shape LDD. The lightly doped drain (LDD) includes a side LDD which abuts against a vertical exposed transistor's body area or silicon surface with a uniform (110) crystalline orientation, and further includes a bottom LDD which abuts against a horizontal exposed transistor's body area or silicon surface with a uniform (100) crystalline orientation. In one embodiment, the thickness of the L-shape LDD or the side LDD is adjustable, and the sidewall of the side LDD could be aligned with the sidewall of the spacer 30, as shown in FIG. 2D. Furthermore, in another embodiment the vertical exposed silicon surface has its vertical boundary with a suitable recessed thickness in contrast to the edge of the gate structure. The vertical exposed silicon surface is substantially aligned with the gate structure.

Moreover, the side LDD and the bottom LDD could be formed based on a Selective Epitaxial Growth (SEG) technique to grow silicon from the vertical exposed silicon surface with organized (110) lattice and from the horizontal exposed silicon surface with organized (100) lattice, respectively. The thickness of the oxide-V layer and oxide-B layer is not so thick (such as 2~5 nm), therefore, it could be said that most of the side LDD is grown from the vertical exposed silicon surface with a (110) crystalline structure, and most of the bottom LDD is grown from the bottom exposed silicon surface with a (100) crystalline structure.

Figure 3:
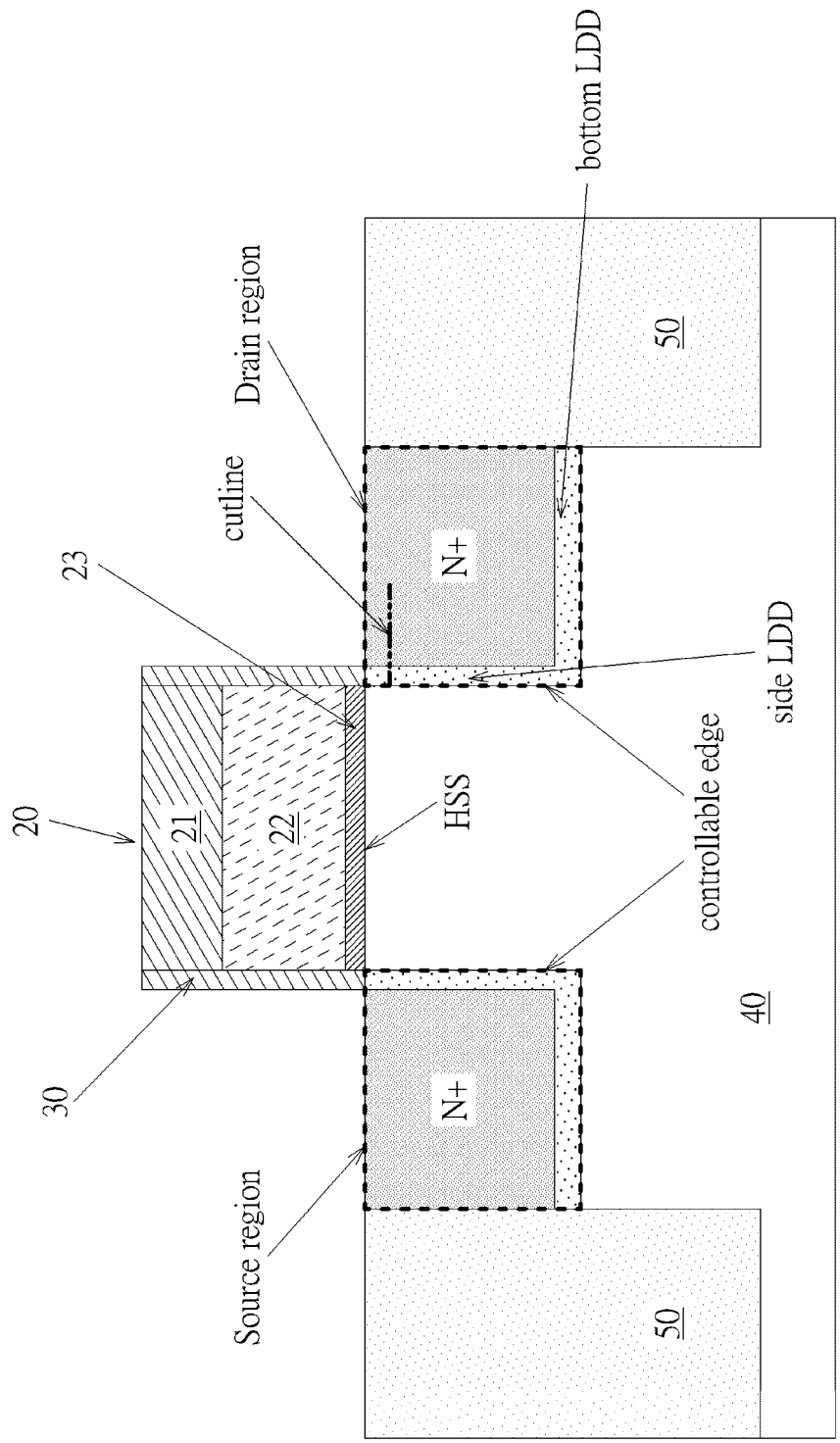
FIG. 3 is a diagram illustrating a cross section of a NMOS fin-structure transistor structure according to the present invention.

In FIG. 3, highly N+ doped regions are then formed by SEG technique based on the side LDD and the bottom LDD. That is, the highly N+ doped region is totally shielded from the P-well or silicon substrate by the side LDD and the bottom LDD. It could also could be said that, as shown in FIG. 3, the highly doped N+ region is surrounded by the side LDD, the bottom LDD and STI, and is shielded from the N-well or silicon substrate. In this embodiment, the source region (or the drain region) is a composite region includes the highly doped N+ region, the side LDD and the bottom LDD.

It is mentioned that there is no ion-implantation process which can only be formed from the top silicon downward into the source/drain regions and no thermal annealing process which can make junction boundaries hard to be defined and controlled. In traditional transistor structure, the LDD region is formed by implanting ions into the semiconductor substrate, and such LDD region formed by ion-implantation process is still part of the silicon substrate. However, it is noted that the side LDD and the bottom LDD of this present invention are independent from the silicon substrate, and are not part of the silicon substrate. The present invention can more precisely define the boundary edge of source/drain to the edge of the effective channel region and this boundary can be well aligned to the edge of gate structure for minimizing SCE, GIDL and junction leakage currents. Additionally, since the side LDD covers most sidewall of the final source trench (or the final drain trench) and seamlessly glues the vertical exposed silicon surface of the FinFET, the effective vertical depth of the channel region of the fin-structure transistor would be deemed substantially the same as the vertical depth of sidewall of the final source or drain trench.

Of source, the lightly doped drain (LDD) and the heavily N+ doped region could be formed based on other suitable technology which may be Atomic Layer Deposition ALD or selective growth ALD-SALD to grow silicon from the exposed transistor's body area or silicon surface which is used as crystalline seeds to form new well-organized lattice.

There are some novel results achieved: (1) The well-defined crystalline silicon structures between the effective channel length and the newly formed (110) LDD regions which result in closely seamless full coverage of the Fin structure perfectly intacted with interfaces of newly laterally grown (110) source/drain region; in addition, the effective channel conduction regions surrounded by gate dielectrics in so called Fin or Tri-gate structures are tightly connected by the LDD regions of the composite source/drain region like horizontal conducting extensions, which gives exactly controlled size of transistor width/depth just like the Tri-gate shape so that the On-current be flowed more uniformly than that of the conventional Tri-gate transistor; (2) The formed LDD regions and highly doped regions can grow with in-situ doped dopants of either phosphorous/arsenic atoms for NMOS or boron atoms for PMOS. With such an in-situ doping silicon-growth technique the source/drain can be well designed to have LDD structures for controllable lateral distances and then be changed to heavily doped region of the composite source/drain regions; (3) Since there is no need to use ion-implantation to form LDD so that there is no need to use thermal Annealing process to reduce defects. Therefore, as no extra defects are generated once which were induced and hard to be totally eliminated even by annealing process, any unexpected leakage current sources should be significantly minimized. So it is expected that this lateral outgrowth formed (110) LDD regions with precisely controllable SEG should create better high quality/high-performance Source/Drain-to-Channel conduction mechanism. The sub-threshold leakage should be reduced. The channel conduction performance should be enhanced since the conduction mechanism from channel through LDD to heavily-doped region of the composite source/drain regions can thus have a holistic design even including some stressed-channel-mobility-enhancement technique by inserting foreign atoms/ions uniformly into source/drain regions could have synergistic effects for enhancing On-conduction performance; (4) Another big advantage is that since the vertical boundary between the Gate-edge and the lateral outgrowth formed (110) LDD regions can be well defined based on thermal-oxidation controllability, the GIDL effect should be reduced in contrast to the conventional way of using LDD implantation to serve as the alignment of Gate-edge to LDD.

To sum up, since the lateral outgrowth formed LDD regions of source/drain regions are outgrown directly from crystalline planes of both transistor channel and body regions, their interfaces are formed seamless with the same (110) lattice orientation so that the device width/depth covering the top horizontal edge and two vertical edges of the Fin structure is precisely controlled to a maximized uniformity. Furthermore, except the bottom LDD, the plane of the side LDD regions is outgrown horizontally from both transistor channel body with in-situ doping technique during the SEG, there is no ion-implantation process which can only be formed from the top silicon downward into the source/drain regions and no thermal annealing process which can make junction boundaries hard to be defined and controlled. The present invention can more precisely define the boundary edge of source/drain to the edge of the effective channel region and this boundary can be well aligned to the edge of Gate for minimizing SCE, GIDL and junction leakage currents.

Figure 4:
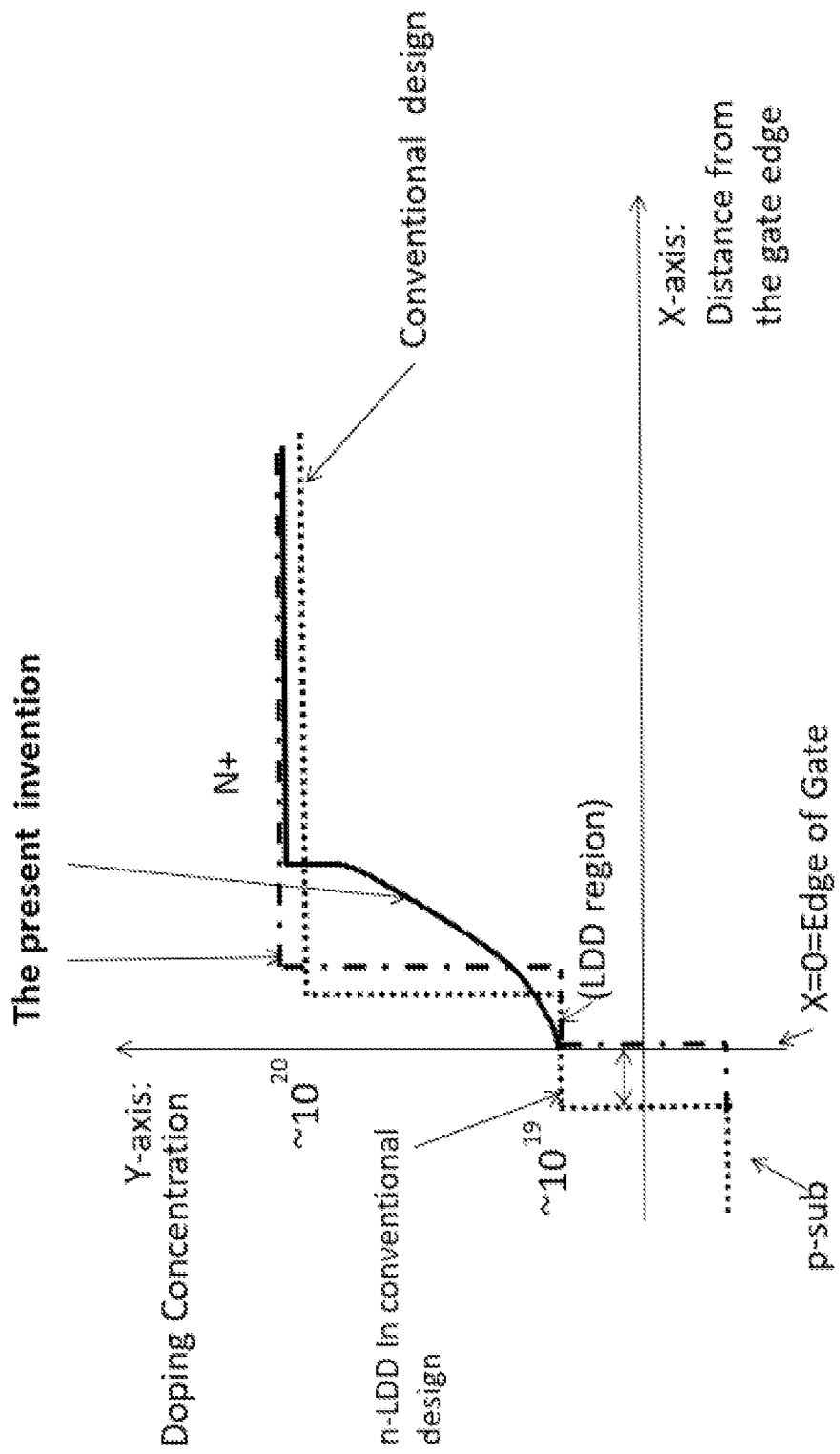
FIG. 4 is a diagram illustrating several doping concentration profiles of different drain regions based on the marked cutline in FIG. 3.

Moreover, in the present invention the horizontal SEG formation of LDD to heavily doped regions even including various non-silicon dopants such as Germanium or Carbon atoms to increase stresses to enhance channel mobilities. The doping concentration profile is controllable or adjustable in the SEG/ALD formation of source/drain regions according to the present invention. FIG. 4 shows several doping concentration profiles of different drain regions based on the marked cutline in FIG. 3, wherein the X-axis represents distance measured from the gate structure edge (or a predetermined edge approximate to the gate structure edge) of the MOSFET, and the Y-axis represents doping concentration. In conventional MOSFET structure, due to formation of n-LDD region by the ion implementation, the n-LDD region will horizontally penetrate into some region underneath gate structure (dot line in FIG. 4), and the penetrating portion of the n-LDD region is unavoidable to shorten the effective channel length. On the other hand, according to the present invention, due to formation of n-LDD region by SEG or ALD process directly from the vertical surface of the transistor body, the n-LDD region will not penetrate underneath the gate structure (dash line and solid line in FIG. 4) and the effective channel length would not be shortened accordingly. Furthermore, the doping concentration profile in the drain region from edge of the gate structure would be gradually increased, for example, from $10^{19}$ in n-LDD region to $10^{20}$ in heavily doped region (gradually changed solid line in FIG. 4), or abruptly changed from $10^{19}$ in n-LDD region to $10^{20}$ in heavily doped region (abruptly changed dash line in FIG. 4). Similarly, so is for PMOS as well.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A MOSFET structure comprising:
a semiconductor wafer substrate with a semiconductor surface;
a gate structure over the semiconductor surface;
a channel region under the semiconductor surface;
a first conductive region surrounded by a shallow trench isolation (STI) region and electrically coupled to the channel region; and
a first trench formed below the semiconductor surface and defined by an edge of the channel region and an edge of the STI region which face with each other, wherein the first trench includes a first edge facing the edge of the channel region and a second edge opposing to the first edge, the second edge is aligned with the edge of the STI region;
wherein the first conductive region comprises a lightly doped drain region independent from the semiconductor wafer substrate and a heavily doped drain region; the lightly doped drain region at least laterally extends from the first edge of the first trench and the heavily doped drain region at least laterally extends from the lightly doped drain region, and the first trench accommodates the lightly doped drain region;
wherein the first conductive region comprises a first most external edge facing to the edge of the channel region and a second most external edge opposite to the first most external edge, wherein the second most external edge is faced to and limited by the edge of the STI region, wherein the first edge of the first trench is controllable to align or substantially align with an edge of the gate structure.

2. The MOSFET structure in claim 1, wherein the lightly doped drain region abuts against the channel region.

3. The MOSFET structure in claim 1, wherein the lightly doped drain region is a L-shape LDD comprising a side LDD region covering a sidewall of the first trench and a bottom LDD covering a bottom wall of the first trench.

4. The MOSFET structure in claim 3, wherein the side LDD region abuts against the channel region, and the first conductive region further comprises a highly doped semiconductor region abutting against the side LDD region and the bottom LDD region.

5. The MOSFET structure in claim 4, wherein the heavily doped semiconductor region is shielded from the semiconductor wafer substrate.

6. The MOSFET structure in claim 3, wherein the sidewall of the first trench is aligned or substantially aligned with an edge of the gate structure.

7. The MOSFET structure in claim 3, wherein the channel region is a fin structure, and a vertical depth of the channel region is substantially the same as that of side LDD region.

8. The MOSFET structure in claim 3, wherein the L-shape LDD is formed by selective epitaxy growth or atomic layer deposition, the channel region is a fin structure, and the side LDD region is contacted to a first facet of the fin structure.

9. The MOSFET structure in claim 3, wherein the L-shape LDD is formed without ion implementation, the channel region is a fin structure, and the side LDD region is contacted to a first facet of the fin structure.

10. A MOSFET structure comprising:
a semiconductor wafer substrate with a semiconductor surface;
a gate structure over the semiconductor surface;
a channel region under the semiconductor surface;
a first conductive region surrounded by a STI region, comprising a lightly doped drain region independent from the semiconductor wafer substrate and a heavily doped drain region, and electrically coupled to the channel region;
a first trench formed below the semiconductor surface and defined by an edge of the channel region and an edge of the STI region which face with each other, wherein the first trench includes a first edge facing the edge of the channel region and a second edge opposing to the first edge, the second edge is aligned with the edge of the STI region, wherein the lightly doped drain region at least laterally extends from the first edge of the first trench; and the heavily doped drain region at least laterally extends from the lightly doped drain region; and
wherein the first edge of the first trench is controlled by a thickness of a thermal oxidation layer;
wherein the first conductive region comprises a first most external edge facing to the edge of the channel region and a second most external edge opposite to the first most external edge, wherein the second most external edge is faced to and limited by the edge of the STI region.

11. The MOSFET structure in claim 10, wherein the first edge of the first trench is revealed after the thermal oxidation layer is removed.

12. A MOSFET structure comprising:
a semiconductor wafer substrate with a semiconductor surface;
a gate structure over the semiconductor surface;
a channel region under the semiconductor surface;
a first conductive region surrounded by a STI region and electrically coupled to the channel region; and
a first trench formed below the semiconductor surface and defined by an edge of the channel region and an edge of the STI region which face with each other, wherein the first trench includes a first edge facing the edge of the channel region and a second edge opposing to the first edge, the second edge is aligned with the edge of the STI region;

wherein the first conductive region comprises a lightly doped drain region independent from the semiconductor wafer substrate and a heavily doped drain region; and the first trench accommodates the lightly doped drain region; wherein a vertical edge of the lightly doped drain region is parallel to a vertical edge of the gate structure;

wherein the first conductive region comprises a first most external edge facing to the edge of the channel region and a second most external edge opposite to the first most external edge, wherein the second most external edge is faced to and limited by the edge of the STI region; the first most external edge is controllable to align or substantially align with an edge of the gate structure.

13. The MOSFET structure in claim 12, wherein the vertical edge of the lightly doped drain region is substantially aligned with the vertical edge of the gate structure.

* * * * *